(12) United States Patent
Haberer et al.

(10) Patent No.: US 10,107,679 B2
(45) Date of Patent: Oct. 23, 2018

(54) OPTOELECTRONIC SAFETY SENSOR

(71) Applicant: SICK AG, Waldkirch/Breisgau (DE)

(72) Inventors: Manfred Haberer, Riegel (DE);
Andreas Schieber, Denzlingen (DE);
Frank Haberstroh, Waldkirch (DE)

(73) Assignee: SICK AG, Waldkirch/Breisgau (DE)

( * ) Notice: Subject to any disclaimer, the term of this patent is extended or adjusted under 35 U.S.C. 154(b) by 769 days.

(21) Appl. No.: 14/497,908

(22) Filed: Sep. 26, 2014

(65) Prior Publication Data

US 2015/0105873 A1    Apr. 16, 2015

(30) Foreign Application Priority Data

Sep. 30, 2013 (EP) .................................. 13186702

(51) Int. Cl.
| | |
|---|---|
| *G01J 1/44* | (2006.01) |
| *G01V 8/10* | (2006.01) |
| *G05B 19/05* | (2006.01) |
| *H03K 19/177* | (2006.01) |
| *G01S 17/88* | (2006.01) |

(52) U.S. Cl.
CPC ............... *G01J 1/44* (2013.01); *G01S 17/88* (2013.01); *G01V 8/10* (2013.01); *G05B 19/058* (2013.01); *H03K 19/17764* (2013.01)

(58) Field of Classification Search
CPC ........................................................ G01J 1/44
USPC ............................................................ 700/79
See application file for complete search history.

(56) References Cited

U.S. PATENT DOCUMENTS

| | | | |
|---|---|---|---|
| 4,319,332 A | 3/1982 | Mehnert | |
| 6,856,862 B1 | 2/2005 | Feltner | |
| 2003/0182010 A1* | 9/2003 | Erhardt | ............... G05B 19/414 |
| | | | 700/117 |
| 2004/0075548 A1 | 4/2004 | Beggs et al. | |
| 2004/0104717 A1 | 6/2004 | Bondarev et al. | |
| 2004/0162996 A1* | 8/2004 | Wallace | .................. H04L 67/12 |
| | | | 726/1 |
| 2011/0273723 A1 | 11/2011 | Haberer et al. | |
| 2013/0038882 A1 | 2/2013 | Umeda et al. | |

FOREIGN PATENT DOCUMENTS

| | | |
|---|---|---|
| DE | 2818942 A1 | 11/1979 |
| DE | 10201894 A1 | 7/2003 |
| EP | 1302784 A2 | 4/2003 |
| EP | 2048557 A1 | 4/2009 |
| EP | 2315052 A1 | 4/2011 |
| EP | 2386876 A1 | 11/2011 |
| EP | 2012201 A1 | 1/2015 |

* cited by examiner

*Primary Examiner* — James D. Rutten
(74) *Attorney, Agent, or Firm* — Nath, Goldberg & Meyer; Jerald L. Meyer

(57) ABSTRACT

The invention relates to an optoelectronic safety sensor comprising an electronic measuring device for generating measured signals which depend on a state of a safety zone observed by the safety sensor and an electronic evaluation unit for evaluating the measured signals. The electronic evaluation unit comprises a programmable logic controller integrated into the optoelectronic safety sensor for the logic evaluation of logic state variables which are derived from the measured signals.

18 Claims, 2 Drawing Sheets

OPTOELECTRONIC SAFETY SENSOR

Figure 1:
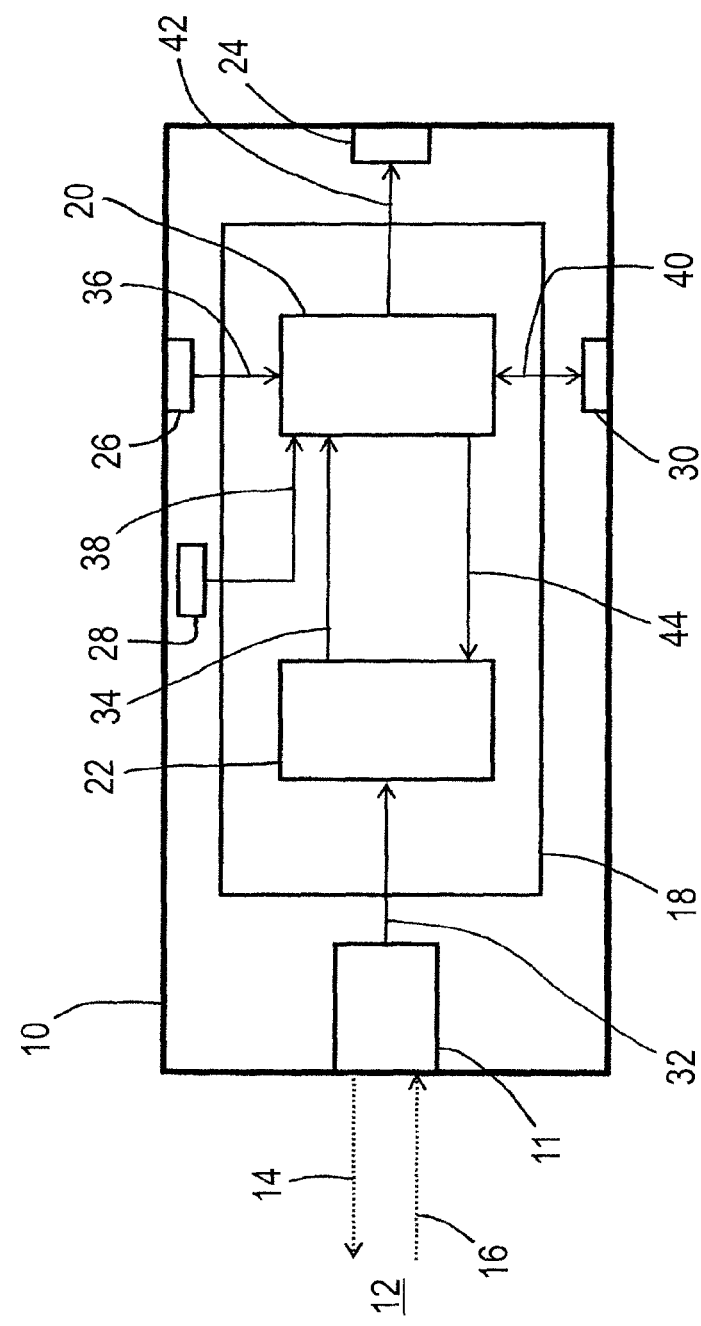

This is a Nonprovisional Application filed under 35 U.S.C. 111(a) claims priority benefit from European Application Number 13186702.0, filed Sep. 9, 2013, the content of which is hereby incorporated by reference in its entirety.

The invention relates to an optoelectronic safety sensor, preferably a laser scanner, a light grid or a camera.

Known optoelectronic safety sensors comprise an optoelectronic measuring device for generating measured signals which depend on a state of a safety zone monitored by the safety sensor and an electronic evaluation unit for evaluating the measured signals. Such optoelectronic safety sensors are used, for example, in industrial production plant for securing dangerous sites. A laser scanner or a light grid can monitor, for example, whether an endangered object such as the hand of an operator is present in a danger zone of a machine, for example in the vicinity of a press. In this case, a safety switch-off of the press can be required to stop a dangerous movement of the press. A secure control of a plant with the aid of a safety sensor can also comprise the control of active process steps in dependence on objects present in a safety zone.

It may be meaningful in practice to logically link the information delivered by the optoelectronic safety sensor, e.g. a piece of safety information which states whether an object signifying a danger is present in the observed safety zone or not, with further information such as safety information of other protective devices before a control decision is made e.g. on the switching off of a machine.

A safety system for securing an industrial production plant therefore comprises, in addition to the optoelectronic safety sensor, a safety control which is communicatively connected to the optoelectronic safety sensor and, optionally, to further protective devices in order to exchange pieces of information which are logically linked with one another in the safety control for fixing the control decision.

A selection logic can also be implemented in the safety control which makes a decision on a protected zone to be observed by the optoelectronic sensor in dependence on the available information. Depending on this selection, the safety control can generate a binary encoded signal and can transmit it to the optoelectronic safety sensor so that the safety sensor observes the corresponding protected field.

The implementation of a functional safety system in the above-described manner is associated with a very high effort. A plurality of components have to be procured and configured and wired with one another in a specific manner for the implementation of the safety system. The planning of the safety system is complex and error-prone due to the plurality of components involved and the required configurations and wiring.

The response time of the safety system is increased by the line lengths and signal transit times resulting from the wiring of the safety sensor and of further components to the safety control, which makes larger safety spacings or protected fields necessary.

It is therefore the object of the invention to provide an optoelectronic safety sensor with which a functional safety system with a small response time can be provided with a smaller effort and a smaller error proneness and to provide a corresponding safety system.

The object is satisfied by an optoelectronic safety sensor having the features of claim 1.

The optoelectronic safety sensor which is a laser scanner, a light grid or a camera in preferred embodiments comprises an optoelectronic measuring device for generating measured signals which depend on a state of a safety zone observed by the safety sensor and an electronic evaluation unit for evaluating the measured signals. The electronic evaluation unit comprises a programmable logic controller integrated into the optoelectronic safety sensor for the logic evaluation of logic state variables which are derived from the measured signals.

It was recognized within the framework of the invention that a programmable logic controller can be integrated in an optoelectronic safety sensor with a comparatively small effort which is configured for the evaluation of logic state variables which are derived from the measured signals of the optoelectronic measuring device and which are here also called logical state variables "of the measuring device". The programmable logic controller can in this respect be implemented with little effort using the hardware infrastructure already present in the optoelectronic safety sensor. Since the integrated programmable logic controller takes over the work of a conventional safety control and optionally further work, a functional safety system can be implemented using the optoelectronic safety sensor in accordance with the invention without a separate safety control, whereby the effort required for the implementation of the safety system is substantially reduced.

Since the programmable logic controller is also "onboard" the safety sensor and the state variables derived from the measured signals are directly available in the optoelectronic safety sensor, the signal transit times and the delays accompanying the wiring of the optoelectronic safety sensor with a separate safety control are avoided. Instead, the safety sensor takes over control work or the generation of corresponding control signals itself, whereby the response time of the safety system is reduced.

Advantageous embodiments of the invention are described in the dependent claims, in the description and in the Figures.

In accordance with an advantageous embodiment, the programmable logic controller is a programmable logic controller "in software". A programmable logic controller in software, which is also called a soft PLC, can be integrated in an optoelectronic safety sensor with an especially small effort without an excessive additional hardware effort or an excessive increase of the construction space required for the implementation of the safety sensor resulting. The programmable logic controller can be formed at least partly and preferably completely by existing hardware components which are configured in a technical program manner for implementing the programmable logic controller. The soft PLC can e.g. be provided in that the existing hardware is configured with a corresponding software module to be executed on the hardware.

The evaluation unit can comprise an application module which is configured to generate the logic state variables from the measured signals or from measured values derived therefrom. The logic state variables can contain information on a state of the observed safety zone, in particular information on objects present in the safety zone, i.e. e.g. on the presence, the position and/or properties of objects in the safety zone.

The logic state variables can represent a secure state or a non-secure state of the observed safety zone. The terms "secure" and "non-secure" in this connection preferably relate to whether an object is present in the observed safety zone which possibly signifies a danger to a person during the operation of the observed plant or of a machine of the plant such as a body part of an operator or not.

The optoelectronic measuring device is preferably configured to receive electromagnetic radiation incident on the measuring device from the safety zone and to generate electrical received signals therefrom which, for example, depend on the intensity of the returning radiation. The evaluation unit can process the received signals to derive information on objects present in the safety zone from the received signals.

The optoelectronic measuring device can, for example, be formed by an optoelectronic camera sensor which is preferably configured to generate spatially resolved images of the safety zone.

The optoelectronic measuring device can also be configured to transmit electromagnetic radiation into the safety zone and to receive the transmitted radiation when it returns from the safety zone. By evaluating the corresponding received signals, the evaluation unit can derive information on whether the light path of the respective transmitted radiation running through the safety zone is free or is interrupted by an object. In the following, the term "light" will be used generally for electromagnetic radiation of different wavelengths, that is e.g. visible radiation, infrared radiation or ultraviolet radiation.

The optoelectronic measuring device is preferably configured to sample the safety zone spatially and/or temporally. For the temporal sampling, at least one respective received signal is generated and evaluated from radiation which is received at different points in time. For the spatial sampling, radiation can be irradiated on different light paths into the safety zone and a respective received signal can be generated and evaluated with respect to the different light paths.

With a laser scanner, for example, the radiation is transmitted into the safety zone in different consecutive directions. With a light grid, a plurality of pairs of a respective one transmitter and one receiver are provided which realize different light paths through the safety zone. A spatial sampling or resolution of the safety zone can also be achieved by different sensor elements of a camera sensor.

The evaluation unit and in particular the application module is preferably configured to generate a spatially and/or temporally resolved image of the safety zone from the received signals generated in the course of the spatial and/or temporal sampling or resolution and to derive the information on objects present in the safety zone or on the secure or non-secure state of the safety zone from it.

The application module can be configured, as will be explained more exactly in the following, to monitor the safety zone in accordance with a predefined and in particular adjustable protected field. The protected field is preferably formed by a predefinable part of the safety zone which can be observed as a maximum by the measuring device. The application module is preferably configured to generate logic state variables which depend on the presence, on the position and/or on properties of objects present in the protected field. For this purpose, the application module can selectively evaluate the received signals associated with the respective part of the safety zone and/or the application module can control the measuring device so that the generation of the received signals is adapted to the respective protected field by the measuring device. The protected field can e.g. comprise a part of the safety zone in which no object is expected during the proper operation of the machine so that a presence of an object in this part of the safety zone indicates a non-secure state.

In accordance with an advantageous embodiment, the programmable logic controller and the application module are formed at least partly and preferably completely by a common processing unit. The programmable logic controller is in this respect preferably a soft PLC. The effort for the provision of the safety sensor is kept low by a common processing unit which is configured in a technical program manner to implement the programmable logic controller and the application module at least in part or completely. The common processing unit preferably comprises a digital signal processing unit and can, for example, comprise a common microprocessor which implements the programmable logic controller and the application module at least partly and preferably completely.

The evaluation unit is preferably configured to adopt a control measure, in particular for controlling a plant observed by the safety sensor or at least one actuator of the plant which can e.g. be a secure drive, in dependence on a safety evaluation which comprises a logic evaluation carried out by the programmable logic controller. The control measure preferably comprises the generation of a control signal by the evaluation unit and the safety sensor can comprise a signal output for outputting the control signal. The safety evaluation underlying the control measure preferably comprises the logic evaluation of the logic state variables derived from the measured signals of the measuring device and can alternatively or additionally comprise the logic evaluation of further logic state variables which can be derived from the information signals of further internal or external components, as is described in detail in the following. A secure control of the observed plant or of the actuator is preferably achieved by the control measure dependent on the safety evaluation. The above-described function of the safety sensor based on the safety evaluation is also called a control or safety function.

An active control of the plant observed by the safety sensor can take place by the logic evaluation and the control measure dependent thereon. This means that the plant or the at least one actuator of the plant is controlled by the safety sensor for carrying out active process steps. An actuator controlled by the safety sensor can e.g. comprise a drive, in particular a secure drive, a processing device, a conveying device or a similar actuator whose actions are required for carrying out the respective process, e.g. an industrial production process. The observed plant can be an industrial production plant.

For the purpose of the active control, for example when the safety sensor detects a specific object or a specific procedure in the safety zone, this information can be processed by the programmable logic controller and can in particular be linked with logic state variables of further components and an actuator can thereupon be controlled in order e.g. to trigger an action of a processing device or any other action necessary for the process such as a movement of an object.

Alternatively or additionally to an active control, a safety switch-off of the plant observed by the safety sensor can be triggered by the logic evaluation and by the control measure dependent thereon, i.e. a process carried out by the plant can be stopped in dependence on the evaluation carried out. The safety switch-off can e.g. be activated when an object is detected in the safety zone by the safety sensor which signifies a danger or when a non-secure state of the safety sensor is present. In this case, a safety relay which can e.g. be controlled by a control signal of the safety sensor and which is in particular interposed in the power supply of the machine can be provided as an actuator and/or at least one OSSD output (OSSD=output signal switching device) can be provided to output the control signal. The OSSD output can, for example, be connectable to an external safety relay to control the external safety relay by the control signal preferably formed as an OSSD signal.

Since the programmable logic controller is integrated into the safety sensor, no separate safety control or wiring to such a safety control is necessary for implementing the described control or safety function in a safety system. Instead, the safety sensor or its evaluation unit can be connected in the safety system, in particular via the above-described signal output, directly to the plant to be controlled or to the at least one actuator to be controlled and can in particular communicate directly therewith. For example, the signal output can be connected directly to the secure drive to control the secure drive.

In accordance with an advantageous embodiment, the evaluation unit is configured to receive and evaluate information signals from at least one further component. The evaluation preferably comprises a logic evaluation of logic state variables, which are derived from the information signals, by the programmable logic controller. The logic evaluation is preferably part of a safety evaluation in accordance with the above description, i.e. the logic evaluation preferably serves for the control of the observed plant or of at least one actuator of the plant. The logic state variables which are derived from the information signals and which are also called logic state variables "of the respective component" are preferably logically linked with the logic state variables from the measuring device, in particular as part of the safety evaluation. In this manner, a safety function can be implemented with a small effort which depends on the state of the safety sensor and on the state of the further component. The safety sensor and the at least one further component can be part of a safety system. Since the programmable logic controller is integrated into the safety sensor, the control of the observed plant dependent on the information signals of the measuring device and on the further components can then also be realized without a separate safety control being necessary.

In accordance with an advantageous embodiment, the at least one component is an internal signal generator, i.e. a signal generator integrated in the safety sensor, or an external signal generator. The evaluation unit can accordingly comprise at least one signal input for receiving information signals of at least one external signal generator and/or can be configured for receiving information signals of at least one signal generator integrated in the safety sensor.

The signal generator can, for example, be a protective device, an encoder, a rotary encoder, a position switch, a limit switch, a key switch or an operating unit for a user.

The operating unit can, for example, allow an operator input for overcoming a restart block and/or for setting a protected field of the safety sensor. The evaluation unit is configured to evaluate the operator inputs in order to overcome a restart block in dependence thereon, that is to eliminate a blocking carried out automatically after a safety measure such as the switching off of a machine and preventing a switching back on of the machine, or to set a protected field of the safety sensor in dependence on the operator input. The blocking can be carried out by the safety sensor as a part of the safety function.

As described above, the signal generator can be a protective device, in particular an external protective device. The information signal can be a safety signal generated by the protective device. The safety signal preferably represent a secure state or a non-secure state of the protective device, with the terms "secure" and "non-secure" relating to whether a state possibly dangerous for the safety of a person is found or not. The external protective device can observe the same plant as the optoelectronic safety sensor or the same machine or a different machine of the plant. The safety evaluation carried out by the safety sensor can comprise a logic evaluation of the logic state values which are derived from the information signals of the external protective device.

The protective device can, for example, be an emergency off switch, a light grid, a laser scanner, a retainer for a protective door, a safety switch or a similar protective device. The safety signal can, for example, be a test signal or an OSSD signal which is preferably transferred via a line associated with the external protective device from the external protective device to the safety sensor. The safety signal can also be transferred via a, preferably secure, field bus to the safety sensor at which one or more external protective devices can be linked in addition to the safety sensor.

The evaluation unit can have an in particular secure input at which the safety signals from the external protective device are received. A secure input is characterized by a failsafe evaluation of the incoming signals and can be implemented, for example, by a redundant evaluation which can e.g. be carried out by two mutually monitoring microprocessors. A secure input can receive the signals from exactly one external protective device or, in particular on a use of a fieldbus, from a plurality of external devices.

In accordance with a further embodiment, the at least one component is a process data network which is configured for transferring process data which relate to a process which is observed by the safety sensor and into which the plant observed by the safety sensor is linked. The safety sensor can in this respect implement a safety function which takes account of the process data transmitted from the process data network.

The safety sensor can be configured for receiving and evaluating information signals from a plurality of types, and in particular all above-described types, of further components, i.e. internal or external signal generators or process data networks. Logic state variables derived from the information signals can be logically evaluated by the programmable logic controller, in particular as part of the safety evaluation, and can preferably be linked with the logic state variables from the measuring device and/or with the logic state variables from another further component, in particular from another component type.

Complex safety systems can be implemented with a low effort using the safety sensor configured in this manner; they can comprise, in addition to the optoelectronic safety sensor, one or more further components such as one or more protective devices, in particular external protective devices, and a control or safety function can be realized which takes account of the state of these further components. For example, the logic state variables from the measuring device and from at least one further component can be linked within the framework of a safety evaluation carried out for an active control of the plant. The state variables can also be linked such that a switching off of a machine of the observed plant takes place when the safety sensor or the protective device indicates a non-secure state.

In accordance with an advantageous embodiment, the safety sensor is configured to monitor a settable protected field, with the programmable logic controller integrated into the safety sensor being configured to determine the protected field to be set by a logic evaluation.

The protected field to be set can be determined by the programmable logic controller in dependence on logic state variables from the measuring device and/or, where present, in dependence on logic state variables from one or more further components which can comprise at least one internal or external signal generator such as an external protective device and/or at least one process data network, with the logic state variables from different devices (safety sensor, further components) being able to be logically linked with one another. A setting of the protected field which corresponds to a desired function of the safety sensor can thereby be achieved with a small effort. For example, the protected field setting can be dependent at least on the logic state variables of an external or internal signal generator, in particular a position switch or key switch, or on the logic state variables of the process data network or on a logic link of the logic state variables of the external or internal signal generator and of the process data network.

The programmable logic controller can be configured to provide a control signal, in particular a binary encoded control signal, to the application module which identifies the protected field to be set. The application module can be configured to monitor the safety zone in the initially described manner in accordance with the identified protected field.

In accordance with an embodiment, the evaluation unit is configured to generate an information signal in dependence on a logic evaluation carried out by the programmable logic controller and to transmit it to a process data network which is configured for transferring process data which relate to a process observed by the safety sensor. The safety sensor and the process data network can be part of a safety system. The information transferred from the safety sensor can, for example, comprise a piece of information on a protected field set at the safety sensor or on a diagnosis status of the safety sensor.

The safety sensor can have a network interface for connection to a process data network and in particular for linking to a bus line of the process data network. Alternatively or additionally to a network interface, the safety sensor can have a diagnosis output for outputting information signals which represent a diagnosis status of the safety sensor.

The programmable logic controller can be a secure programmable logic controller. Such a control is characterized by a failsafe evaluation which can be achieved, for example, by a redundant evaluation.

The measuring device and the evaluation device are preferably accommodated in a common housing of the safety sensor which is preferably configured in the manner of the housing protection IP 67.

A further subject matter of the invention is a safety system comprising at least one optoelectronic safety sensor in accordance with the invention in accordance with the present description. The advantages and advantageous embodiments described in the present description with respect to the safety sensor and to its inclusion or use in a safety system represent corresponding advantages and advantageous embodiments of the safety system. As described above, the safety sensor can be connected directly, e.g. without a separate safety control, to an actuator of the plant such as a secure drive and can be configured to control it in dependence on the logic evaluation which is carried out by the programmable logic controller integrated in the safety sensor.

Figure 2:
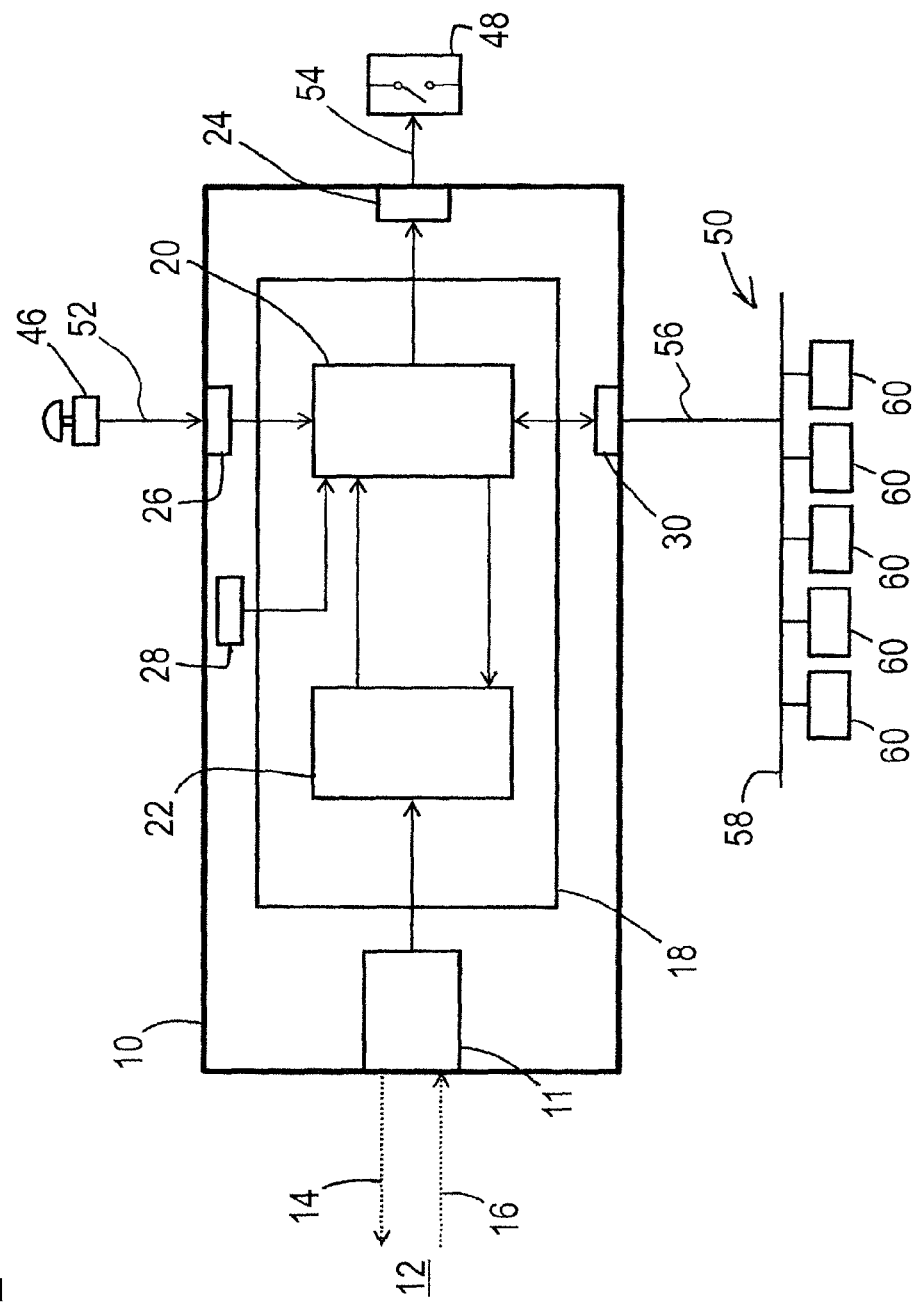

The invention will be described in the following by way of example with reference to advantageous embodiments and to the enclosed Figures. There are shown:

FIG. 1 an optoelectronic safety sensor in accordance with an embodiment of the invention in a schematic representation; and FIG. 2 a safety system in accordance with an embodiment of the invention comprising the safety sensor shown in FIG. 1 in a schematic representation.

The safety sensor 10 shown in FIG. 1 comprises an optoelectronic measuring device 11 which is configured to transmit the electromagnetic radiation 14 shown by a dashed arrow in FIG. 1 into a safety zone 12 and to receive radiation 16, likewise shown by a dashed arrow, returning from the safety zone 12 and to generate received signals from it which depend on the intensity of the returning radiation 16, with the term "intensity" also comprising the presence or non-presence of returning radiation 16. The measuring device 11 could also be formed by a camera sensor. In this case, the transmission of transmitted radiation 14 can be dispensed with and the camera sensor can receive the already present radiation which is incident onto the measuring device 11 from the safety zone 12.

The received signals are provided from the measuring device 11 via the connection 32 of an electronic evaluation unit 18. An application module 22 determines logic state variables from the received signals in dependence on a protected field set at the application module 22, the logic state variables represent a secure state or non-secure state of the safety zone 12 in the present embodiment. The logic state variables are provided from the application module 22 to the evaluation unit 18 via the connection 34 of a programmable logic controller 20.

The evaluation unit 18 is moreover configured to derive logic state variables from information signals which can be received from an external protective device at a secure input 26 and can provide them via the connection 36 to the programmable logic controller 20. Furthermore, information signals generated from an internal signal generator 28, configured e.g. as a key switch, of the safety sensor 10 are received by the evaluation unit 18 which derives logic state variables from the information signals and provides them to the programmable logic controller 20 via the connection 38. In addition, process data can be received from a process data network via a network interface 30 and logic state variables can be derived from them by the evaluation unit 18 and can be provided to the programmable logic controller 20 via the connection 40.

The programmable logic controller 20 is configured to logically evaluate the logic state variables from the application module 22, from the secure input 26, from the internal signal encoder 28 and from the network interface 30 and to link them logically to one another. In dependence on the logic evaluation, the evaluation unit 18 generates a control signal which is formed as an OSSD signal and which is provided to the OSSD output 24 via the connection 42 and can there be output to a safety relay, for example, for switching off a machine. In addition, a further signal output, not shown in FIG. 1, can be provided for the active control of a plant observed by the safety sensor 10.

The logic evaluation in the programmable logic controller 20 additionally comprises the selection of the protected field to be monitored by the safety sensor 10. The programmable logic controller 20 generates a control signal which identifies the protected field to be set and which is provided to the application module 22 via the connection 44. The application module 22 receives this control signal and represents the respective protected field. The setting of the protected field can take place by a corresponding evaluation in the application module 22, for example in that a corresponding selection of the received signals received is used for the generation of the logic state variables. The setting of the protected field can also comprise a corresponding change of the measuring procedures carried out by the measuring device 11, with the application module 22 correspondingly controlling the measuring device 11 via the connection 22 configured as a bidirectional connection in this case.

The evaluation unit 18 in addition generates information signals in dependence on the logic evaluation carried out by the programmable logic controller 20 which, for example, represent information on a currently set protected field or on a diagnosis status of the safety sensor 10 and provides the corresponding information signals via the connection 40 to the network interface 30 for outputting to an optionally present process data network.

The programmable logic controller 20 and the application module 22 can both be realized at least in part by a common processing unit of the evaluation unit 18, in particular a common microprocessor.

FIG. 2 shows a safety system which comprises the optoelectronic safety sensor 10 shown in FIG. 1.

The safety system furthermore comprises an external protective device 46 which is configured as an emergency stop button, which generates a safety signal in dependence on an actuated or non-actuated state of the emergency stop button 46 and which provides it to the secure input 26 via the connection 52, the safety signal representing a secure state or a non-secure state.

Furthermore, an external safety relay 48 is provided which is interposed in the power supply of a machine of the observed plant such that the power supply can be interrupted and the machine can thereby be stopped by opening the relay 48. The relay 48 is connected to the OSSD output 24 via the connection 54 so that the relay 48 can be controlled by the OSSD signal provided at the OSSD output 24 for opening and closing. In addition to the relay 48, an actuator, not shown in FIG. 2, of the plant observed by the safety sensor 10 can be provided which can be controlled via a corresponding signal output of the safety sensor 10 in dependence on the logic evaluation carried out in the programmable logic controller 20 for the active control of the plant.

Finally, a process data network 50 is provided which comprises a plurality of bus users 60 connected to a bus line 58 of the network 50, wherein the bus line 58 is connected to the network interface 30 via the connection 56 such that the information exchange described above with respect to FIG. 1 between the safety sensor 10 and the network 50 is made possible.

REFERENCE NUMERAL LIST 10 optoelectronic safety sensor
11 optoelectronic measuring device
12 safety zone
14 transmitted radiation
16 returning radiation
18 evaluation unit
20 programmable logic controller
22 application module
24 OSSD output
26 secure input
28 internal signal generator
30 network interface
32, 34 connection
36, 38 connection
40, 42, 44 connection
46 protective device
48 safety relay
50 process data network
52, 54, 56 connection
58 bus line
60 bus user

The invention claimed is:

1. An optoelectronic safety sensor, comprising:
an optoelectronic measuring device for generating measured signals which depend on a state of a safety zone observed by the optoelectronic safety sensor; and
an electronic evaluation unit for evaluating the measured signals;
wherein the electronic evaluation unit comprises a programmable logic controller integrated into the optoelectronic safety sensor for logic evaluation of logic state variables, with the logic state variables being derived from the measured signals,
wherein the evaluation unit is configured to initiate a control measure in dependence on a safety evaluation which comprises a logic evaluation carried out by the programmable logic controller,
wherein the programmable logic controller is configured to determine a protected field to be set by a logic evaluation, and to adjust the protected field;
wherein the optoelectronic safety sensor is configured to observe the adjustable protected field; and
wherein the evaluation unit is configured to receive and to evaluate information signals from at least one further component.

2. The optoelectronic safety sensor in accordance with claim 1, wherein the optoelectronic safety sensor is one of a laser scanner, a light grid and a camera.

3. The optoelectronic safety sensor in accordance with claim 1, wherein
the programmable logic controller is a programmable logic controller in software.

4. The optoelectronic safety sensor in accordance with claim 3, wherein
the programmable logic controller in software is a soft PLC.

5. The optoelectronic safety sensor in accordance with claim 1, in which the evaluation unit comprises an application module which is configured to generate the logic state variables from the measured signals or from measured values derived therefrom.

6. The optoelectronic safety sensor in accordance with claim 5, in which the programmable logic controller and the application module are formed at least partly by a common processing unit.

7. The optoelectronic safety sensor in accordance with claim 6, wherein the common processing unit comprises a common microprocessor.

8. The optoelectronic safety sensor in accordance with claim 6, in which the programmable logic controller and the application module are formed completely by a common processing unit.

9. The optoelectronic safety sensor in accordance with claim 8, wherein the common processing unit comprises a common microprocessor.

10. The optoelectronic safety sensor in accordance with claim 1, wherein the control measure comprises the control of at least one actuator of a plant observed by the optoelectronic safety sensor.

11. The optoelectronic safety sensor in accordance with claim 1, wherein the control measure comprises the generation of a control signal by the evaluation unit.

12. The optoelectronic safety sensor in accordance with claim 1, wherein the evaluation comprises a logic evaluation of logic state variables by the programmable logic controller, with the logic state variables being derived from the information signals.

13. The optoelectronic safety sensor in accordance with claim 1, wherein the at least one component is an internal or external signal generator.

14. The optoelectronic safety sensor in accordance with claim 1, wherein the at least one component is a process data network configured for transferring process data, with the data relating to a process observed by the optoelectronic safety sensor.

15. The optoelectronic safety sensor in accordance with claim 1, in which the evaluation unit is configured to generate an information signal in dependence on a logic evaluation carried out by the programmable logic controller and to transmit it to a process data network, the process data network being configured for transferring process data relating to a process observed by the optoelectronic safety sensor.

16. The optoelectronic safety sensor in accordance with claim 1, wherein the programmable logic controller is a secure programmable logic controller.

17. An optoelectronic safety sensor, comprising:
an optoelectronic measuring device for generating measured signals which depend on a state of a safety zone observed by the optoelectronic safety sensor; and
an electronic evaluation unit for evaluating the measured signals;
wherein the electronic evaluation unit comprises a programmable logic controller integrated into the optoelectronic safety sensor for logic evaluation of logic state variables, with the logic state variables being derived from the measured signals,
wherein the evaluation unit is configured to initiate a control measure in dependence on a safety evaluation which comprises a logic evaluation carried out by the programmable logic controller,
wherein the evaluation unit is configured to receive and to evaluate information signals from at least one further component,
wherein the programmable logic controller is configured to both determine and adjust a protected field to be set by logic evaluation based, in part, on the information signals received from the at least one further component, and
wherein the optoelectronic safety sensor is configured to observe the adjustable protected field.

18. An optoelectronic safety sensor, comprising:
an optoelectronic measuring device for generating measured signals which depend on a state of a safety zone observed by the optoelectronic safety sensor; and
an electronic evaluation unit for evaluating the measured signals;
wherein the electronic evaluation unit comprises a programmable logic controller integrated into the optoelectronic safety sensor for logic evaluation of logic state variables, with the logic state variables being derived from the measured signals,
wherein the evaluation unit is configured to initiate a control measure in dependence on a safety evaluation which comprises a logic evaluation carried out by the programmable logic controller,
wherein the programmable logic controller is configured to determine a protected field to be set by a logic evaluation, and to adjust the protected field,
wherein the programmable logic controller is configured to determine a secure state or a non-secure state of the protected field, based on evaluation of the logic state variables,
wherein the optoelectronic safety sensor is configured to observe the adjustable protected field, and
wherein the evaluation unit is configured to receive and to evaluate information signals from at least one further component.

* * * * *